(12) United States Patent
Balakrishnan et al.

(10) Patent No.: US 9,466,702 B1
(45) Date of Patent: Oct. 11, 2016

(54) SEMICONDUCTOR DEVICE INCLUDING MULTIPLE FIN HEIGHTS

(71) Applicant: International Business Machines Corporation, Armonk, NY (US)

(72) Inventors: Karthik Balakrishnan, White Plains, NY (US); Kangguo Cheng, Schenectady, NY (US); Pouya Hashemi, White Plains, NY (US); Alexander Reznicek, Troy, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/963,603

(22) Filed: Dec. 9, 2015

(51) Int. Cl.
*H01L 21/762* (2006.01)
*H01L 29/66* (2006.01)
*H01L 21/311* (2006.01)
*H01L 21/02* (2006.01)
*H01L 29/78* (2006.01)
*H01L 29/06* (2006.01)

(52) U.S. Cl.
CPC ... *H01L 29/66795* (2013.01); *H01L 21/02532* (2013.01); *H01L 21/02538* (2013.01); *H01L 21/02598* (2013.01); *H01L 21/02647* (2013.01); *H01L 21/31111* (2013.01); *H01L 21/31144* (2013.01); *H01L 29/0692* (2013.01); *H01L 29/7851* (2013.01)

(58) Field of Classification Search
CPC ............... H01L 21/823431; H01L 21/66795; H01L 21/76232; H01L 21/845; H01L 21/66484
USPC .......................................... 438/268–272, 424
See application file for complete search history.

(56) References Cited

U.S. PATENT DOCUMENTS

| | | | |
|---|---|---|---|
| 7,544,994 B2 | 6/2009 | Schepis et al. | |
| 7,560,785 B2 | 7/2009 | Yu et al. | |
| 7,612,405 B2 * | 11/2009 | Yu | H01L 21/82343 257/328 |
| 7,781,273 B2 | 8/2010 | Schepis et al. | |
| 8,101,994 B2 * | 1/2012 | Yu | H01L 29/66795 257/330 |
| 8,441,074 B2 * | 5/2013 | Rachmady | H01L 21/76232 257/365 |
| 8,729,611 B2 | 5/2014 | Zhu et al. | |
| 8,987,823 B2 * | 3/2015 | Cheng | H01L 21/845 257/350 |
| 9,029,221 B2 * | 5/2015 | Cappellani | H01L 29/66484 257/365 |
| 2008/0128797 A1 | 6/2008 | Dyer et al. | |
| 2008/0224258 A1 | 9/2008 | Schepis et al. | |
| 2009/0057780 A1 | 3/2009 | Wong et al. | |

* cited by examiner

*Primary Examiner* — Cuong Q Nguyen
(74) *Attorney, Agent, or Firm* — Cantor Colburn LLP; Louis Percello (57) ABSTRACT

A semiconductor device comprising a substrate, an base layer disposed on the substrate having a thickness C in first area and a thickness B in a second area and a hole extending to the substrate filled with semiconductor, a first semiconductor fin disposed on the first area and having a height A, and a second semiconductor fin disposed on the second area and having a height D, wherein (A+C)=(B+D).

13 Claims, 15 Drawing Sheets

SEMICONDUCTOR DEVICE INCLUDING MULTIPLE FIN HEIGHTS

BACKGROUND

As semiconductor technology continues to advance and semiconductor device and structure dimensions continue to decrease a recently evolving trend within semiconductor device and structure fabrication has been the advent of the FinFET device, rather than planar field effect transistor devices. A FinFET device is characterized by a semiconductor fin that is positioned perpendicularly with respect to a semiconductor substrate, to provide a vertical channel within the FinFET device. This vertical channel is covered with a gate dielectric and subsequently with a gate electrode.

As the complexity of semiconductor devices continue to evolve as well as the desire for ever smaller devices, new semiconductor device architecture and methods for making semiconductor devices is needed.

SUMMARY

Disclosed herein is a method of making a semiconductor structure comprising: forming a mask on a first region of a base layer covering a substrate; removing a portion of the base layer from the unmasked region such that the base layer has at least two thicknesses; removing the mask from the base layer having at least two thicknesses; forming at least one hole in the base layer to reveal the substrate; depositing a sacrificial material over the base layer having at least two thicknesses and at least one hole; planarizing the sacrificial material; patterning and etching the sacrificial material to provide an area comprising the hole; disposing a dielectric material over the patterned and etched sacrificial material; patterning and etching the dielectric material to form trenches extending to the base layer on at least two opposing sides of the remaining sacrificial material; removing the sacrificial material beneath the dielectric material to form a cavity bounded by the trenches and comprising the hole; forming a semiconductor material in the cavity on the base layer having at least two thicknesses by lateral epitaxial growth; removing the dielectric material to expose the semiconductor material; patterning and etching the semiconductor material to form a first fin having a first height and a second fin having a second height, wherein the first height does not equal the second height and the top of the first fin and the top of the second fin are equidistant from the surface of the substrate.

Also disclosed herein is a semiconductor device comprising a substrate, an base layer disposed on the substrate having a thickness C in first area and a thickness B in a second area and a hole extending to the substrate filled with semiconductor, a first semiconductor fin disposed on the first area and having a height A, and a second semiconductor fin disposed on the second area and having a height D, wherein (A+C)=(B+D).

Additional features are realized through the techniques of the present invention. Other embodiments are described in detail herein and are considered a part of the claimed invention. For a better understanding of the invention with the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing features are apparent from the following detailed description taken in conjunction with the accompanying drawings in which:

DETAILED DESCRIPTION

Described herein is a method of making a semiconductor structure having fins of differing channels heights while the overall vertical height is the same. Having differing channel heights increases the options for overall design and allows form more diverse devices on a single substrate. Having the same overall vertical height simplifies manufacturing and makes the manufacturing process more reliable and robust. For example, subsequent gate formation frequently involves planarization steps. When the tops of the fins are coplanar it simplifies any planarization processes. The method comprises removing a portion of the base layer and forming the material for the fin on the base layer having differing heights in a way so as to form vertical fins having the same overall height but differing channel heights.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the terms "invention" or "present invention" are non-limiting terms and not intended to refer to any single aspect of the particular invention but encompass all possible aspects as described in the specification and the claims.

Figure 1:
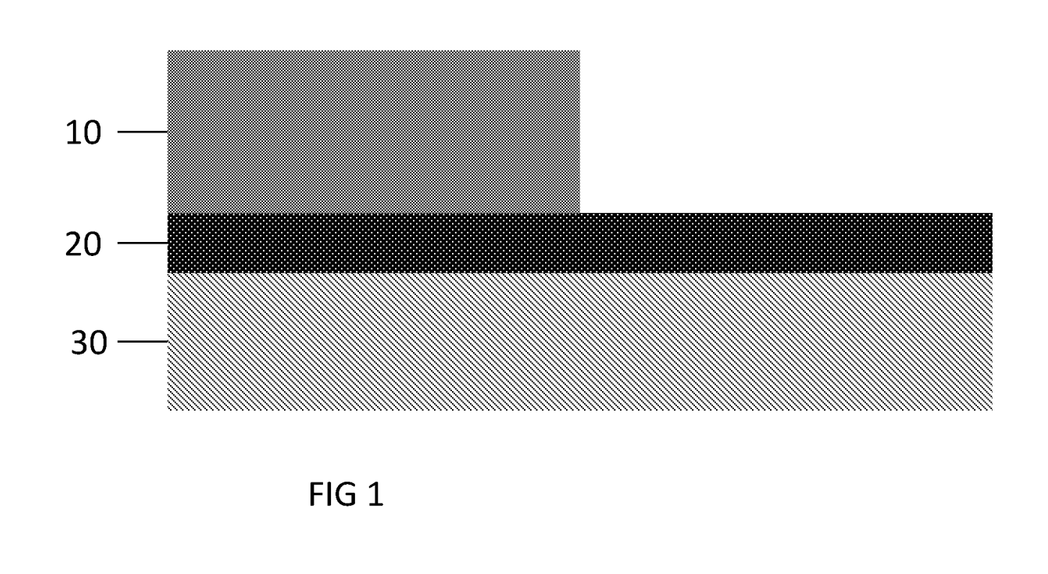
FIG. 1 is a representation of a substrate having a partially masked base layer.

With reference now to FIG. 1, a mask 10 is disposed on a base layer 20. Exemplary mask materials include, for example, silicon oxide, silicon nitride (SiN), silicon oxide carbonitride (SiOCN), silicon boro carbonitride (SiBCN), and combinations comprising one or more of the foregoing. The base layer 20 is disposed on a substrate 30. The base layer comprises a dielectric material. Exemplary dielectric materials comprise oxides, nitrides, oxynitrides, silicates (e.g., metal silicates), aluminates, titanates, nitrides, or any combination thereof. The base layer has a starting thickness of 50 to 500 nanometers, or, more specifically, 100 to 250 nanometers.

The substrate comprises a semiconductor material such as silicon, silicon-germanium, III-V materials, or a combination of two or more of the foregoing. As used herein, the term "III-V semiconductor" denotes a semiconductor material that includes at least one element from Group III of the Periodic Table of Elements (B, Al, Ga, In) and at least one element from Group V of the Periodic Table of Elements (N, P, As, Sb, Bi). Typically, the III-V semiconductors may be binary alloys, ternary alloys, or quaternary alloys, of III-V elements. Examples of III-V semiconductors that can be used in the present invention include, but are not limited to GaAs, InAs, InP, InGaAs, InAlAs, InAlAsSb, InAlAsP, AlInGaP, InGaAsP, and alloys thereof.

Figure 2:
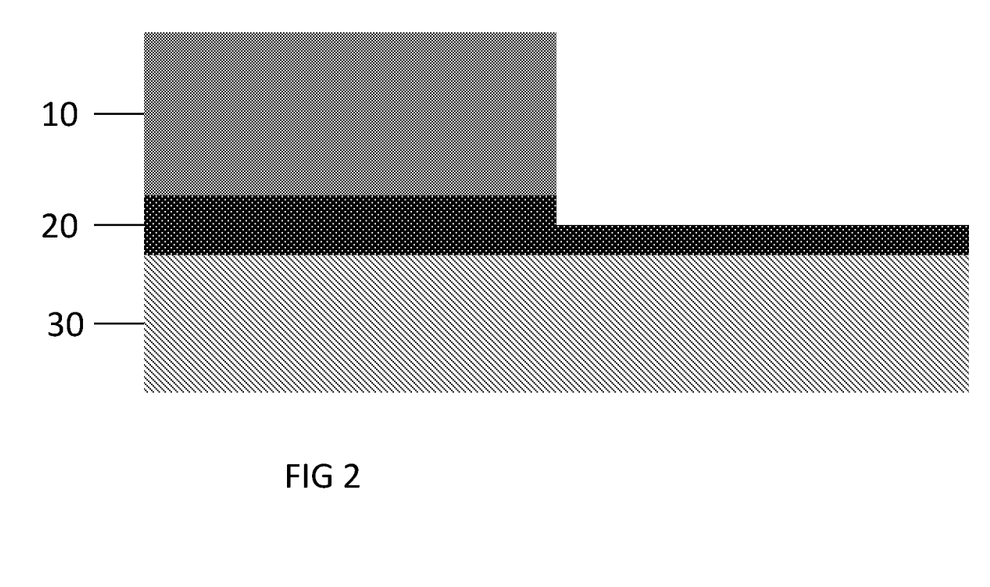
FIG. 2 is depicts the structure of FIG. 1 after partial removal of the unmasked base layer.
Figure 3:
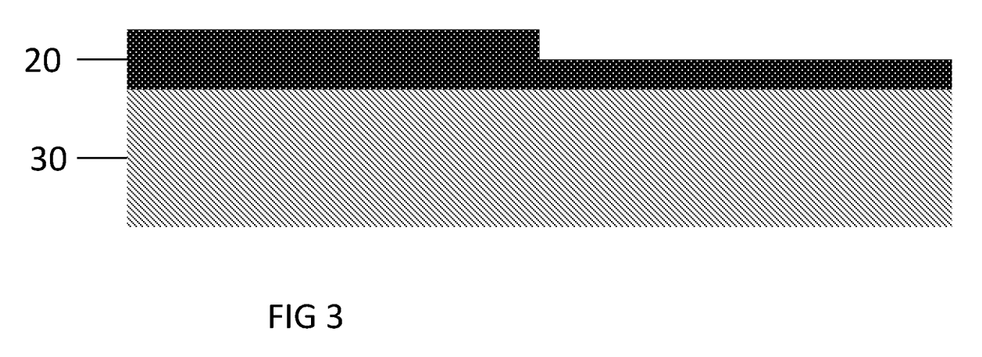
FIG. 3 depicts the structure of FIG. 2 after removal of the partial mask.

A portion of the unmasked base layer is removed as shown in FIG. 2. In some embodiments 5 to 90% of the original base layer thickness is removed. The minimum thickness for the base layer after removal is 10 to 20 nanometers. The base layer can be removed by etching. Exemplary etch processes include dry etching processes and wet etching processes. Dry etching includes, for example, reactive ion etching (RIE), ion beam etching, or plasma etching. The dry etching process may be combined with a wet etching process. Following removal of a portion of the base layer, the mask 10 is removed and results in the structure shown in FIG. 3. FIG. 3 shows the substrate 30 and the base layer 20 where the base layer has at least two regions with differing thicknesses. It is explicitly contemplated that the base layer can comprise three or more thicknesses by repeating the mask and removal steps.

Figure 4:
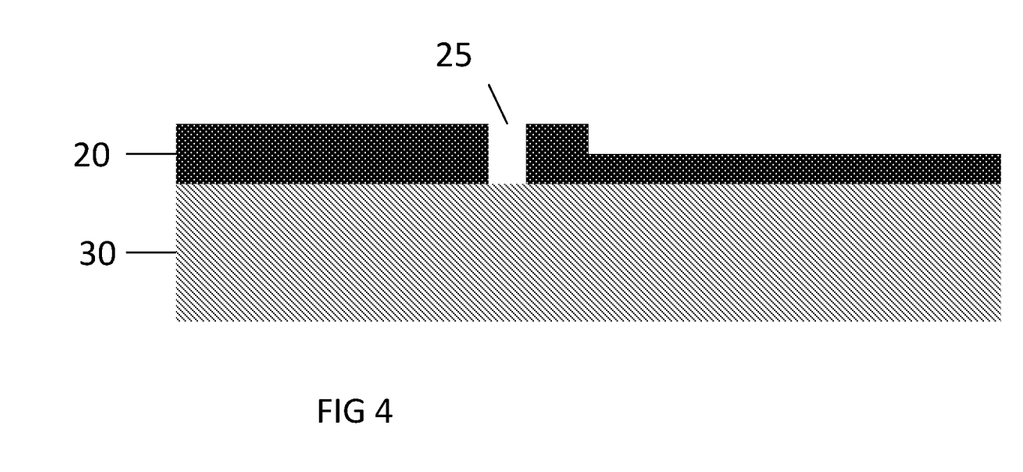
FIG. 4 shows the structure of FIG. 3 after the formation of a hole through the base layer to the substrate.
Figure 5:
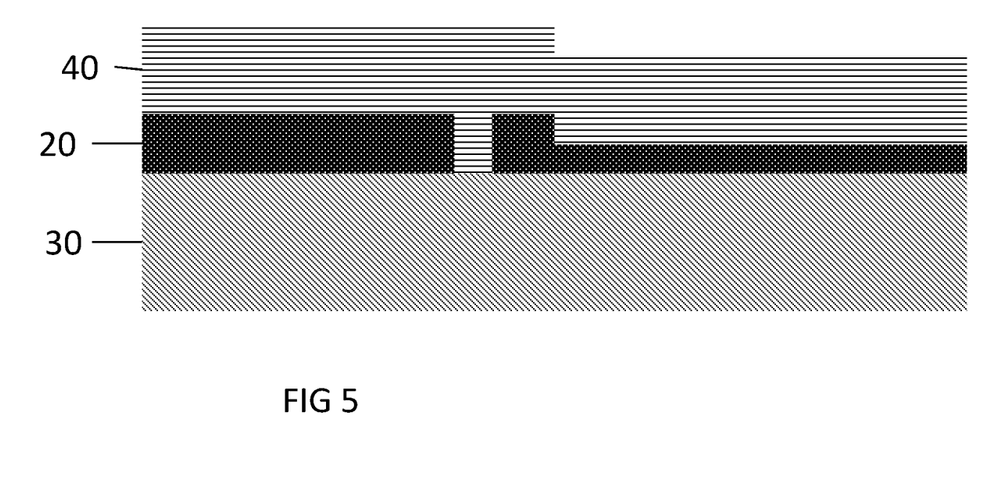
FIG. 5 shows the deposition of sacrificial material on the structure of FIG. 4.

After the mask and base layer removal steps are complete, a hole extending from the surface of the base layer to the substrate is formed using patterning and etching. Patterning is the shaping or altering of deposited materials, and is generally referred to as lithography. For example, in conventional lithography, the material is coated with a chemical called a photoresist; then, a machine called a stepper focuses, aligns, and moves a mask, exposing select portions of the material below to short wavelength light; the exposed regions are washed away by a developer solution. After etching or other processing, the remaining photoresist is removed. Exemplary patterning methods include optical lithography, electron-beam lithography, and nanoimprint lithography. FIG. 4 shows the hole 25. A sacrificial material, 40, is then deposited in the hole and over the base layer as shown in FIG. 5. Exemplary sacrificial materials include silicon nitride, aluminum oxide, hafnium oxide, titanium nitride or amorphous silicon. The sacrificial layer can be deposited using any appropriate method including thermal oxidation, physical vapor deposition (PVD), plasma enhanced chemical vapor deposition (PECVD), microwave enhanced chemical vapor deposition (MECVD), chemical vapor deposition (CVD), electrochemical deposition (ECD), molecular beam epitaxy (MBE) and more recently, atomic layer deposition (ALD), e-beam evaporation, and sputtering, among others.

Figure 6:
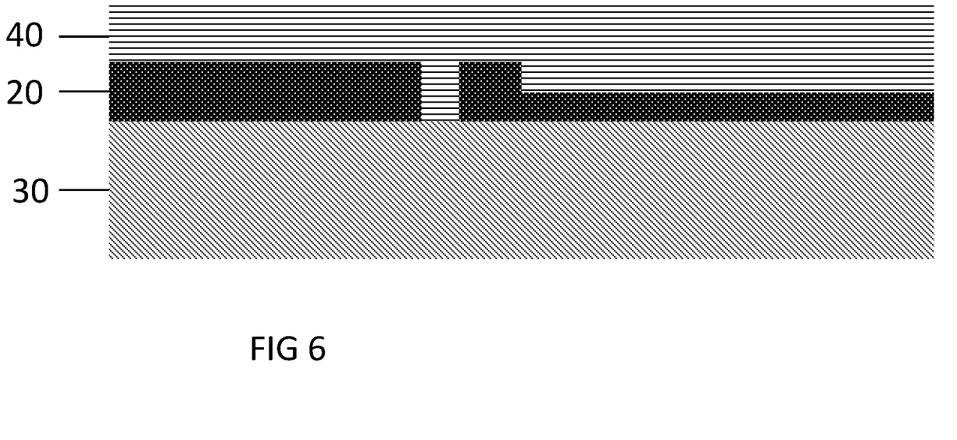
FIG. 6 depicts the structure of FIG. 5 after planarization.
Figure 7A:
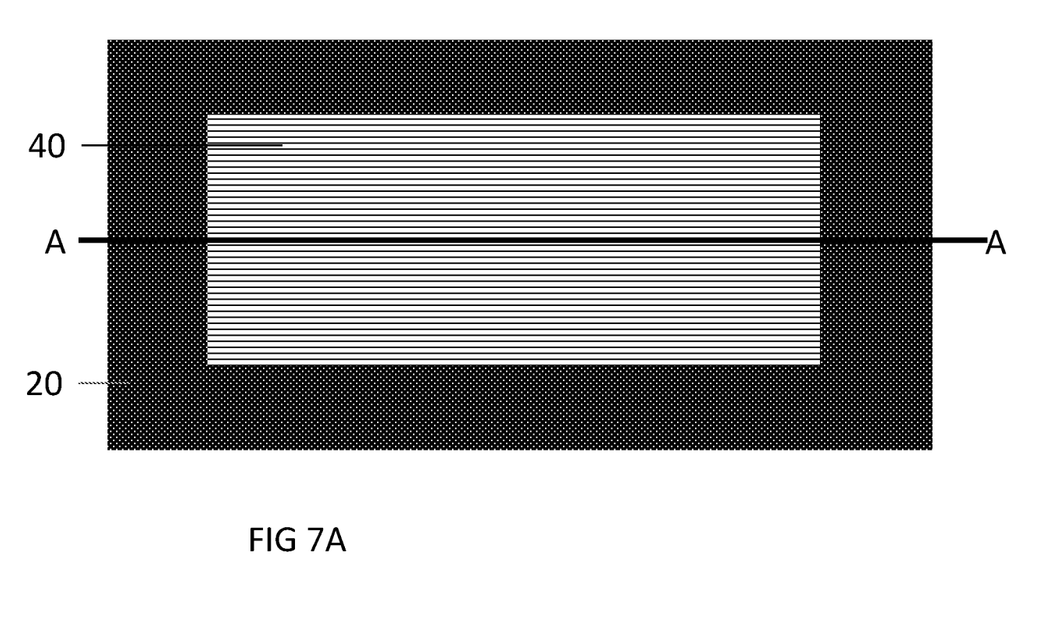
FIG. 7A is a top view after patterning and etching the sacrificial material.
Figure 7B:
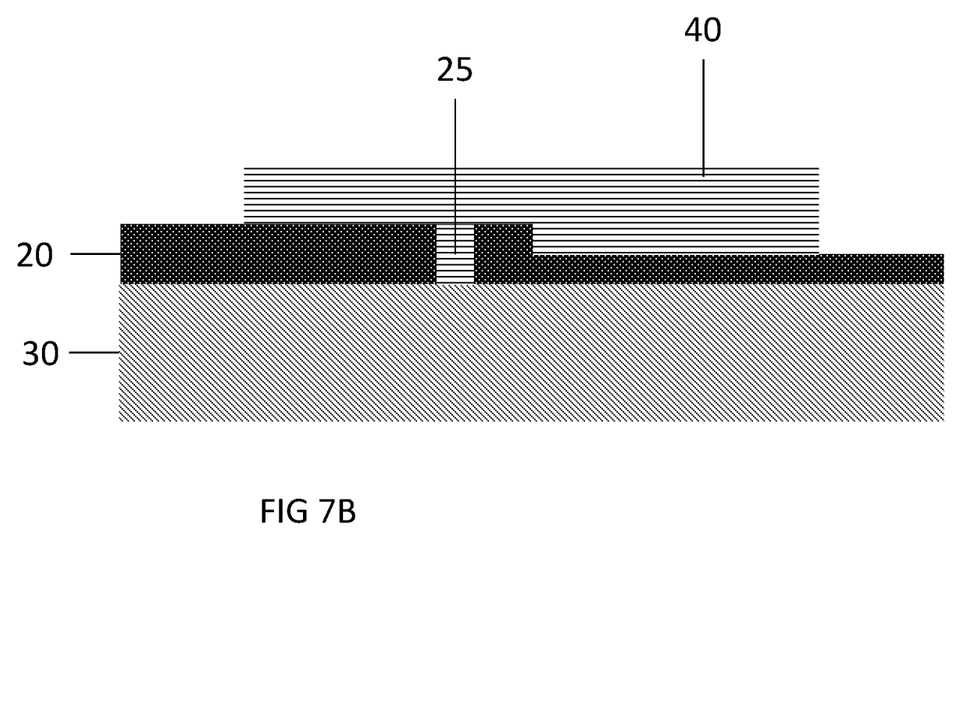
FIG. 7B is a cross section after patterning and etching the sacrificial material.

The sacrificial material is planarized as shown in FIG. 6. The sacrificial material can be planarized using chemical mechanical planarization. After planarization the sacrificial material may have a height of 20 to 200 nanometers above the top of the highest point of the base layer. The sacrificial material is patterned and etched to define active areas where later fins will be formed. The area for formation of fins includes the hole in the oxide which is filled with the sacrificial material. A top view is shown in FIG. 7A. FIG. 7A shows sacrificial material 40 disposed on a portion of base layer 20. FIG. 7B is a cross section of FIG. 7A along line A-A. FIG. 7B shows sacrificial layer 40 disposed on a portion of base layer 20 and in hole 25.

Figure 8:
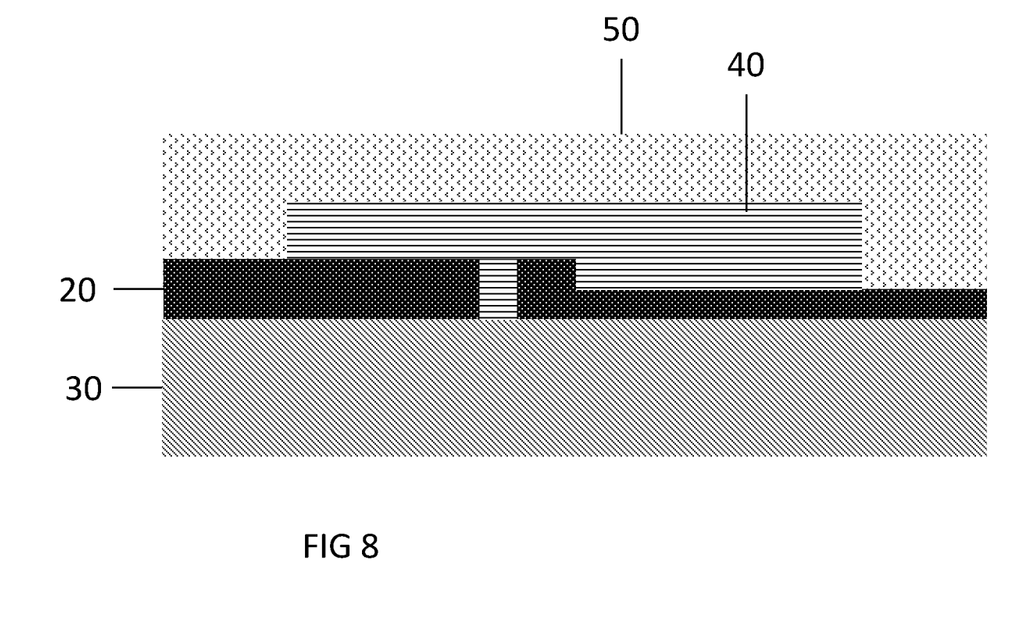
FIG. 8 shows the structure of FIG. 7B after a dielectric material has been deposited.
Figure 9A:
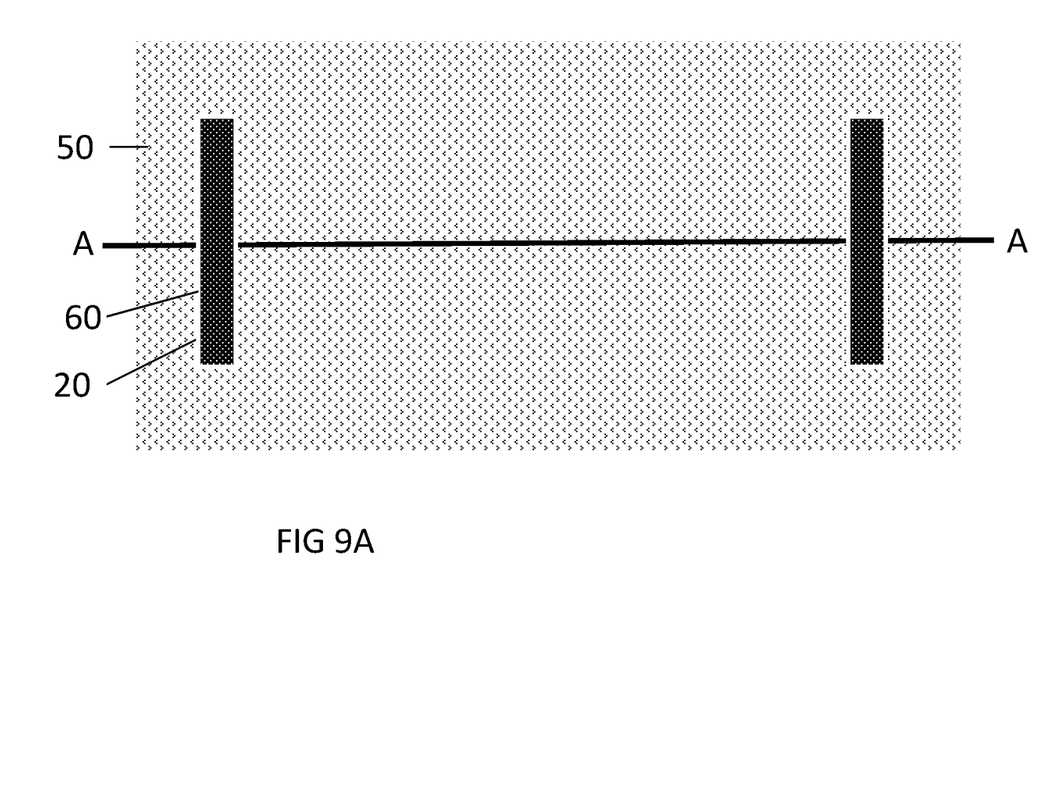
FIG. 9A is a top view after trenches have been etched in the structure of FIG. 8.
Figure 9B:
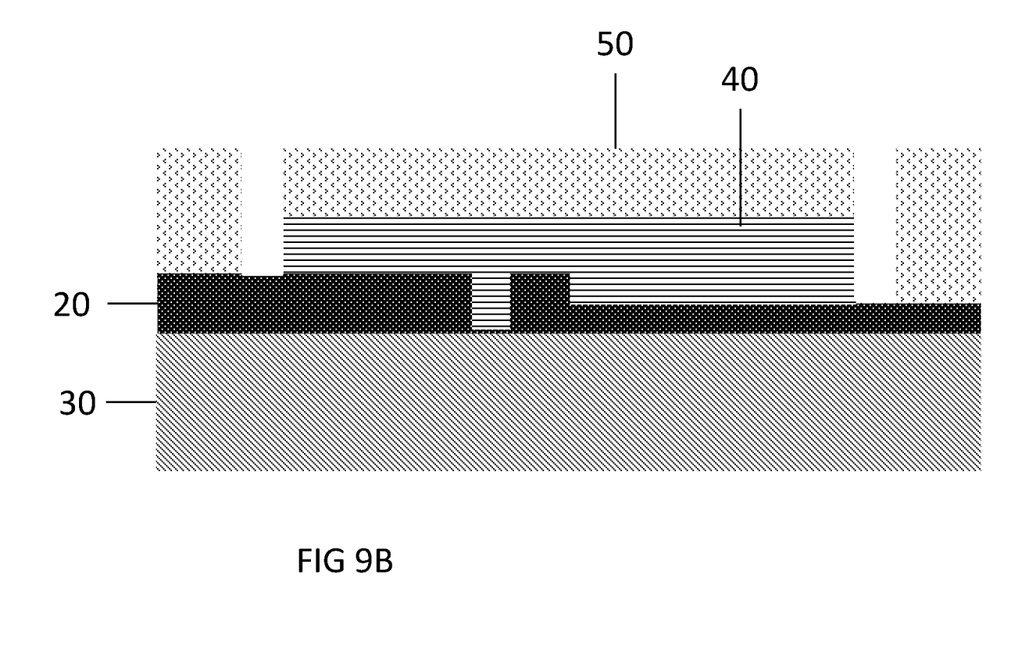
FIG. 9B is a cross section showing the location of the trenches.
Figure 10:
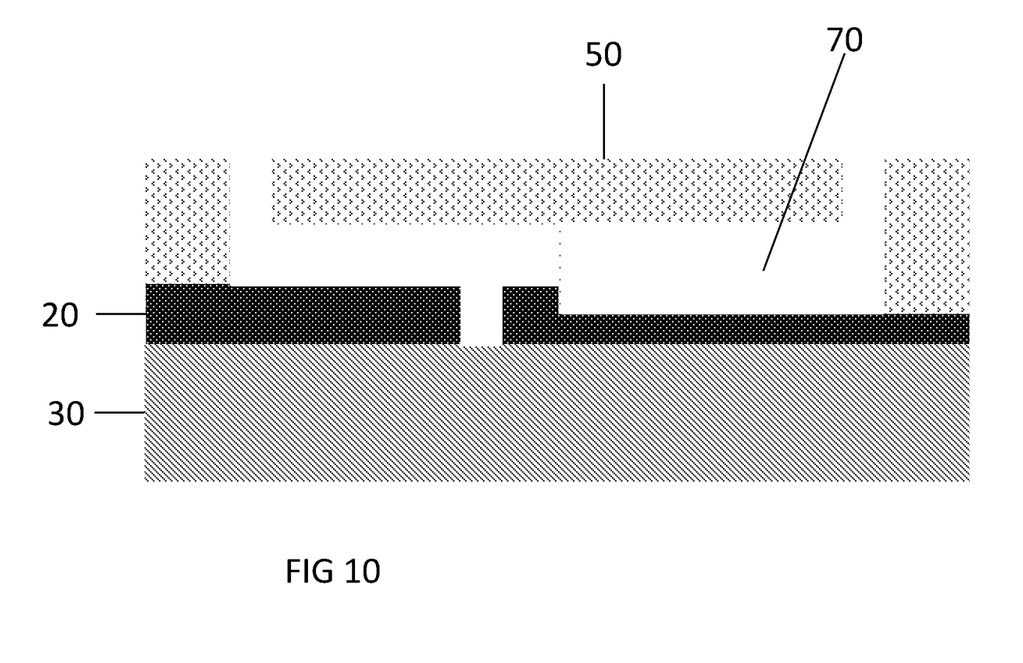
FIG. 10 shows the structure of FIG. 9B after removal of the sacrificial material.
Figure 11:
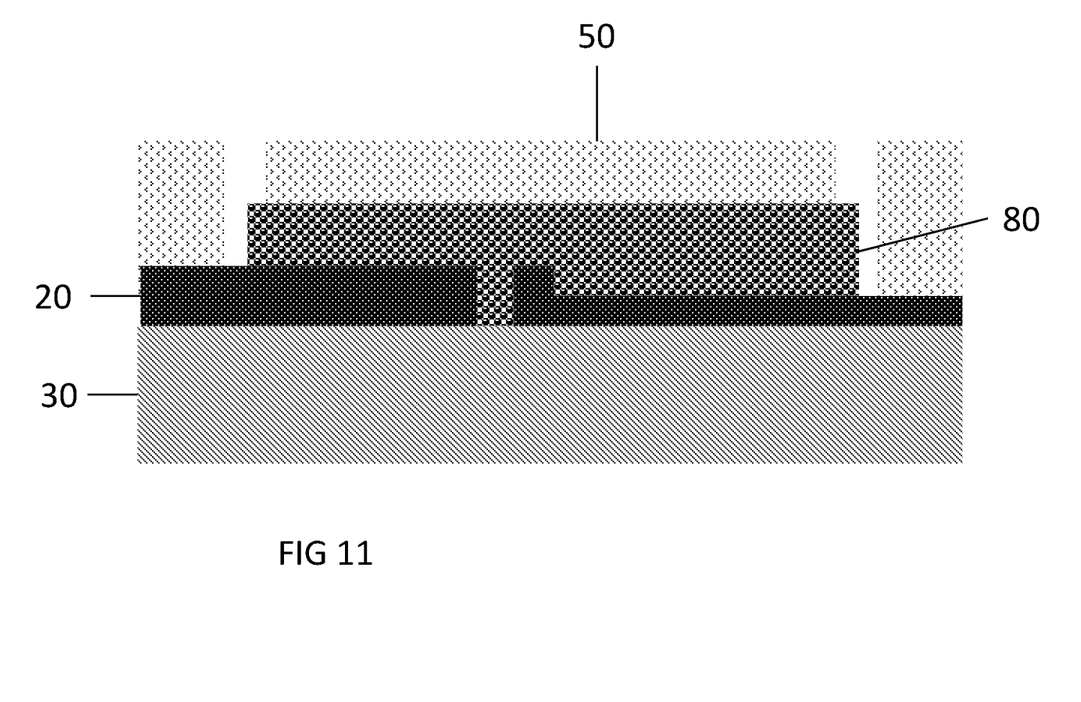
FIG. 11 shows the structure of FIG. 10 after epitaxial growth of a semiconductor.

After the sacrificial material is patterned and etched a dielectric material 50 is deposited over the sacrificial material as shown in FIG. 8. Exemplary dielectric materials include silicon oxide, silicon nitride (SiN), silicon oxide carbonitride (SiOCN), silicon boro carbo nitride (SiBCN), spin-on glass, flowable oxide, high density plasma oxide, borophosphosilicate glass, oxides, nitrides, and oxynitrides. The dielectric material should have a sufficient etch selectivity relative to base layer 20. In some embodiments base layer 20 is silicon oxide, dielectric material 50 is silicon boro carbo nitride (SiBCN) and sacrificial material 40 is silicon nitride. The dielectric material 50 is patterned and etched to form trenches extending to the base layer on at least two opposing sides of the remaining sacrificial material as shown in FIGS. 9A and 9B. The sacrificial material is then removed by a suitable etching process, such as, for example wet etching to form a cavity 70 bounded by the trenches and including the hole as shown in FIG. 10. Semiconductor material 80 is then formed in the cavity by epitaxial lateral overgrowth as shown in FIG. 11. Methods for the epitaxial lateral overgrowth include metal organic chemical vapor deposition (MOCVD), metal organic vapor phase epitaxy (MOVPE), plasma enhanced chemical vapor deposition (PECVD), remote plasma enhanced chemical vapor deposition (RP-CVD), molecular beam epitaxy (MBE), hydride vapor phase epitaxy (HVPE), or liquid phase epitaxy (LPE). By forming the semiconductor material in a bounded cavity the semiconductor material has at least two thicknesses but the upper surface of the semiconductor material is substantially equidistant from the surface of the substrate. Exemplary semiconductors include silicon, silicon-germanium, III-V materials, or a combination of two or more of the foregoing. The semiconductor of the substrate 30 and semiconductor 80 may be the same or different. In some embodiments the semiconductor 80 comprises a III-V material, more specifically, InGaAs, InGaSb or GaAs.

Figure 12:
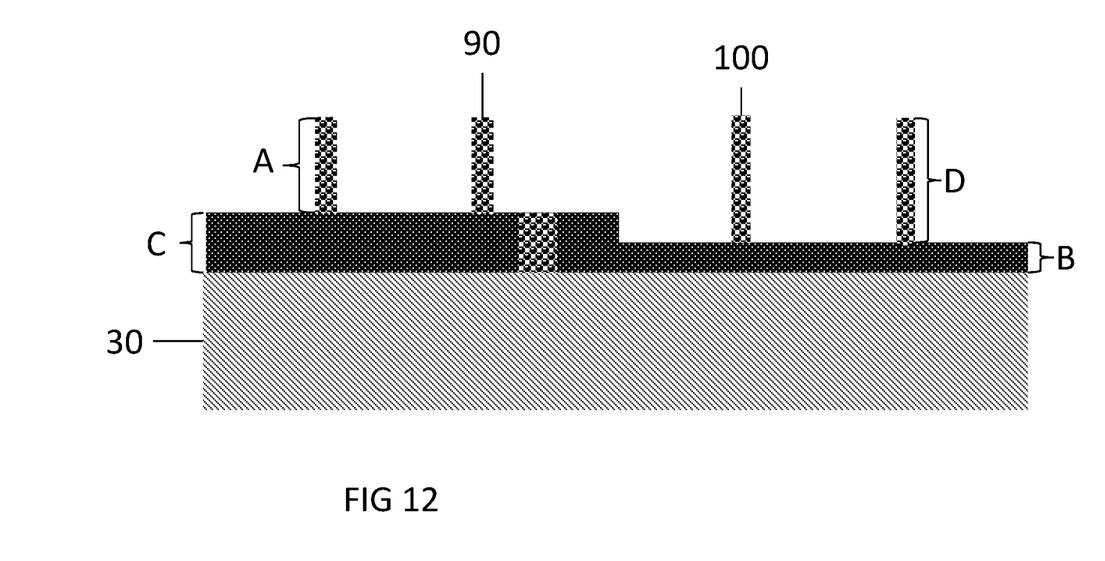
FIG. 12 shows the fins formed by removing the dielectric and patterning and removing the semiconductor.

The dielectric material 50 is then removed by etching to expose the semiconductor material. Exemplary etch processes include dry etching processes and wet etching processes. Dry etching includes, for example, reactive ion etching (RIE), ion beam etching, and plasma etching, The dry etching process may be combined with a wet etching process. The semiconductor material is then patterned and etched to form a first fin 90 and a second fin 100. As shown in FIG. 12, fin 90 having a height A is disposed on oxide having a thickness C and fin 100 having a height D is disposed on oxide having a thickness B. The sum of A and C is equal to the sum of D and C. Fin 90 and fin 100 can have the same or different widths. In some embodiments fin 90 and fin 100 have a width of 4 to 12 nanometers. Within this range the width can be 6 to 8 nanometers. The spacing between the fins is a result of the patterning and the spacing between the fins can be the same or different.

Following the completion of the semiconductor structure shown in FIG. 12, additional conventional processing techniques are performed (e.g., gate oxide formation on the fin sidewalls, gate conductor deposition and patterning, source/drain extension formation, halo formation, spacer formation, source/drain region formation, deposition and planarization of a blanket dielectric later, contact formation, etc.) so as to complete the semiconductor device.

Accordingly, a semiconductor device comprises a substrate, a base layer disposed on the substrate having a thickness C in first area and a thickness B in a second area and a hole extending to the substrate filled with semiconductor, a first semiconductor fin disposed on the first area and having a height A, and a second semiconductor fin disposed on the second area and having a height D, wherein (A+C)=(B+D). The disclosed semiconductor structure allows different multi-gate non-planar field effect transistors to be formed on the same substrate. Furthermore, it allow for the first and second semiconductors to be formed from a single semiconductor conductor. It is contemplated that the first and second semiconductor fins can be each be made of a single semiconductor but each be made of a different single semiconductor. For example, the first semiconductor fin can be made of silicon germanium while the second semiconductor fin can be made of silicon. When the first and second fins are made of different single semiconductors it is anticipated that the process will require an additional hole extending to the substrate to function as a seed region for the epitaxial growth of the second semiconductor. It is also expressly contemplated that the first and second fins can comprise the same single semiconductor material, for example, silicon.

In some embodiments the first fin and the second fin have a width of 4 to 12 nanometers. Within this range the width can be 6 to 8 nanometers. The first fin and the second fin can have the same width or they can have different widths.

In some embodiments, the a semiconductor device comprises a substrate, a base layer disposed on the substrate having a thickness C in first area and a thickness B in a second area and a hole extending to the substrate wherein the hole is filled with semiconductor, a first semiconductor fin disposed on the first area and having a height A, and a second semiconductor fin disposed on the second area and having a height D, wherein (A+C)=(B+D). The substrate comprises silicon. The base layer comprises silicon oxide. The first semiconductor fin comprises a III-V semiconductor such as InGaAs. The second semiconductor fin comprises III-V semiconductor such as InGaAs. The thickness B is 5 to 90% of thickness C.

Figure 13:
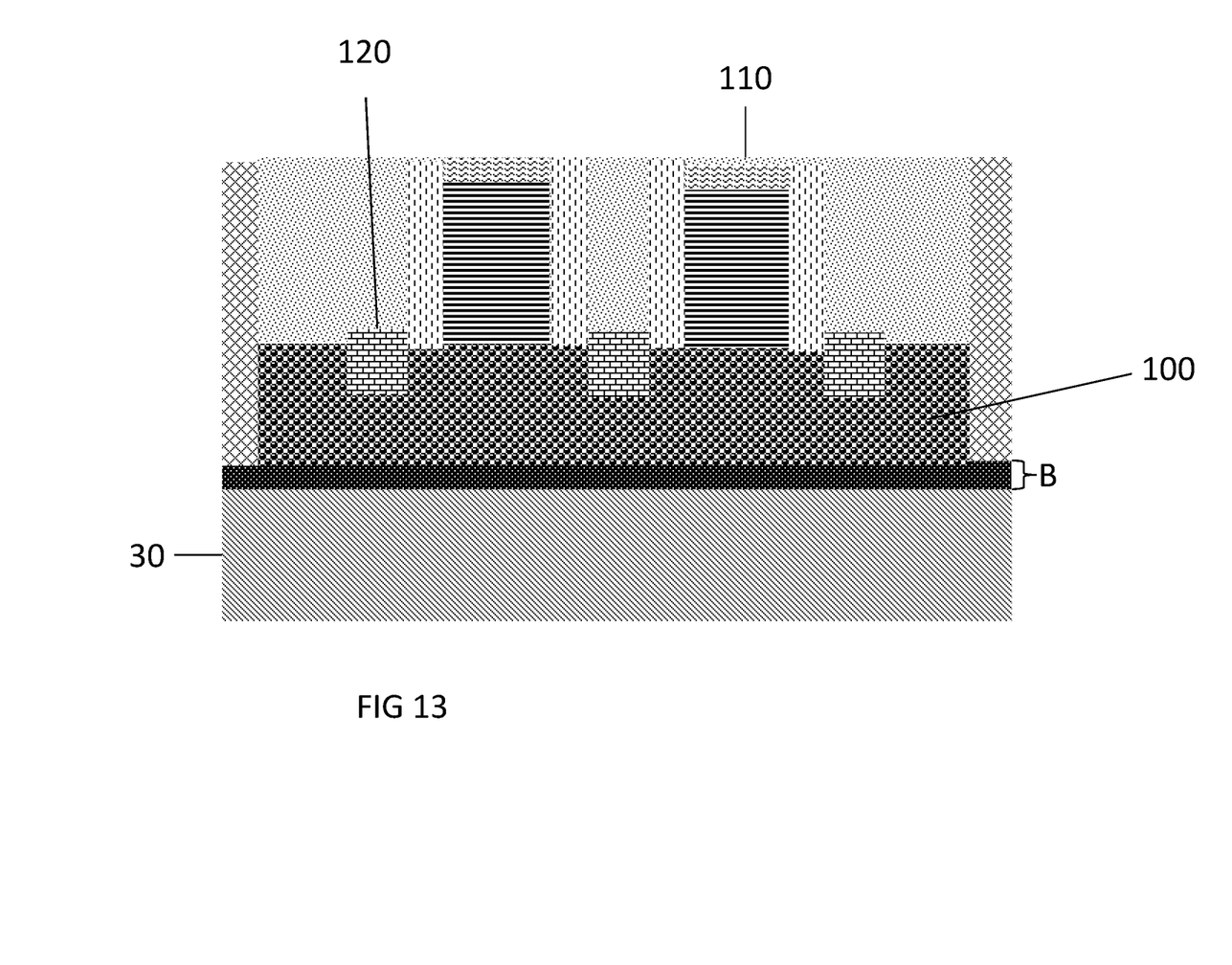
FIG. 13 shows a completed semiconductor device.

A completed semiconductor device is shown in FIG. 13. FIG. 13 is a transverse view along fin 100. Similar structure would be seen in a transverse view along fin 90. Source and drain regions 120 flank the replacement metal gate stacks 110 over the channel regions of the fin 100. The replacement metal gate stacks 110 are capped with a capping layer.

The gate stacks 110 include high-k metal gates formed, for example, by filling a dummy gate opening (not shown) with one or more high-k dielectric materials, one or more workfunction metals, and one or more metal gate conductor materials. The high-k dielectric material(s) can be a dielectric material having a dielectric constant greater than 4.0, 7.0, or 10.0. Non-limiting examples of suitable materials for the high-k dielectric material include oxides, nitrides, oxynitrides, silicates (e.g., metal silicates), aluminates, titanates, nitrides, or any combination thereof. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum.

The high-k dielectric material layer may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the high-k dielectric material may vary depending on the deposition process as well as the composition and number of high-k dielectric materials used. The high-k dielectric material layer may have a thickness in a range from about 0.5 to about 20 nm.

The work function metal(s) may be disposed over the high-k dielectric material. The type of work function metal (s) depends on the type of transistor and transistor material and may differ between the NFET and the PFET. Non-limiting examples of suitable work function metals for silicon or silicon germanium include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof.

A conductive metal is deposited over the high-k dielectric material(s) and workfunction layer(s) to form the gate stacks. Non-limiting examples of suitable conductive metals include aluminum (Al), platinum (Pt), gold (Au), tungsten (W), titanium (Ti), or any combination thereof. The conductive metal may be deposited by a suitable deposition process, for example, CVD, PECVD, PVD, plating, thermal or e-beam evaporation, and sputtering.

A planarization process, for example, chemical mechanical planarization (CMP), is performed to polish the surface of the conductive gate metal.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the inventive teachings and the practical application, and to enable others of ordinary skill in the art to understand the invention for various embodiments with various modifications as are suited to the particular use contemplated.

The diagrams depicted herein are just one example. There may be many variations to this diagram or the operations described therein without departing from the spirit of the invention. For instance, the operations may be performed in a differing order or operations may be added, deleted or modified. All of these variations are considered a part of the claimed invention.

While various embodiments have been described, it will be understood that those skilled in the art, both now and in the future, may make various modifications which fall within the scope of the claims which follow. These claims should be construed to maintain the proper protection for the invention first described.

What is claimed is:

1. A method of making a semiconductor device comprising:
   forming a mask on a portion of a base layer covering a substrate;
   removing a portion of the base layer from the unmasked region such that the base layer has at least two thicknesses;
   removing the mask from the base layer having at least two thicknesses;
   forming a hole in the base layer to reveal the substrate;
   depositing a sacrificial material over the base layer having two thicknesses and a hole;
   planarizing the sacrificial material;
   patterning and etching the sacrificial material to define active areas comprising the hole;
   disposing a dielectric material over the patterned and etched sacrificial material;
   patterning and etching the dielectric material to form trenches to the base layer on two opposing sides of the active area, wherein the trenches are adjacent to the sacrificial material;
   removing the sacrificial material beneath the dielectric material to form a cavity bounded by the trenches and comprising the hole;
   forming a semiconductor layer in the cavity on the base layer having two thicknesses by epitaxial lateral overgrowth;
   removing the dielectric material to expose the semiconductor layer; and
   patterning and etching the semiconductor layer to form a first fin having a first height and a second fin having a second height.

2. The method of claim 1 wherein the base layer comprises silicon oxide and the substrate layer comprises silicon.

3. The method of claim 1 wherein the sacrificial material comprises silicon nitride.

4. The method of claim 1, wherein 5 to 90% of the base layer's thickness is removed.

5. The method of claim 1, further comprising forming a second mask on a portion of the base layer having at least two thicknesses and etching the unmasked area.

6. The method of claim 1, wherein the base layer comprises silicon oxide, the dielectric material comprises silicon boro carbo nitride and the sacrificial material comprises silicon nitride.

7. The method of claim 1, wherein the dielectric material comprises silicon oxide, silicon nitride (SiN), silicon oxide carbonitride (SiOCN), silicon boro carbo nitride (SiBCN), spin-on glass, flowable oxide, high density plasma oxide, borophosphosilicate glass, oxides, nitrides, or oxynitrides.

8. The method of claim 1, wherein the semiconductor layer comprises silicon, silicon-germanium, III-V materials, or a combination of two or more of the foregoing.

9. The method of claim 1, wherein epitaxial lateral overgrowth is achieved by metal organic chemical vapor deposition, metal organic vapor phase epitaxy, plasma enhanced chemical vapor deposition, remote plasma enhanced chemical vapor deposition, molecular beam epitaxy, hydride vapor phase epitaxy, or liquid phase epitaxy.

10. A method of making a semiconductor device comprising:
    forming a mask on a portion of a base layer comprising silicon oxide covering a substrate comprising silicon;
    removing a portion of the base layer from the unmasked region such that the base layer has two thicknesses;
    removing the mask from the base layer having two thicknesses;
    forming at least one hole in the base layer to reveal the substrate;
    depositing a sacrificial material comprising silicon nitride over the base layer having two thicknesses and at least one hole;
    planarizing the sacrificial material;
    patterning and etching the sacrificial material to provide an active area comprising the hole;
    disposing a dielectric material comprising SiOCN, SiBCN, or a combinations there of over the patterned and etched sacrificial material;
    patterning and etching the dielectric material to form trenches to the base layer on at least two opposing sides of the active area, wherein the trenches are adjacent to the sacrificial material;
    removing the sacrificial material beneath the dielectric material to form a cavity bounded by the trenches and comprising the hole;
    forming a semiconductor layer comprising InGaAs in the cavity on the base layer, wherein the semiconductor layer has two thicknesses;
    removing the dielectric material to expose the semiconductor layer; and
    patterning and etching the semiconductor layer to form a first fin having a first height and a second fin having a second height.

11. The method of claim 10, wherein 5 to 90% of the base layer's thickness is removed.

12. The method of claim 10, further comprising forming a second mask on a portion of the base layer having two thicknesses and etching the unmasked area to form a base layer having three thicknesses.

13. The method of claim 10, wherein planarizing is performed using chemical mechanical planarization.

* * * * *